United States Patent [19]

Okada

[11] Patent Number: 4,941,840

[45] Date of Patent: Jul. 17, 1990

[54] CIRCUIT BOARD MOUNTING APPARATUS

[75] Inventor: Kazuo Okada, Kamakura, Japan

[73] Assignee: Universal Co., Ltd., Oyama, Japan

[21] Appl. No.: 274,284

[22] Filed: Nov. 22, 1988

[30] Foreign Application Priority Data

Dec. 11, 1987 [JP] Japan .................. 62-188525

[51] Int. Cl.$^5$ .......................................... H01R 13/629
[52] U.S. Cl. .................................... 439/376; 439/64
[58] Field of Search ................... 439/10, 31, 59, 62, 439/64, 376, 377

[56] References Cited

U.S. PATENT DOCUMENTS 4,790,761 12/1988 Sonobe ................................ 439/59

Primary Examiner—Eugene F. Desmond
Attorney, Agent, or Firm—Staas & Halsey

[57] ABSTRACT

A circuit board mounting apparatus comprising a circuit board case with a circuit board, a circuit board holding member with a connector and a supporting member, wherein the circuit board case has at least one extending portion capable of rotatably engaging with the supporting member so that the circuit board of the case can be easily attached to or detached from the connector of the circuit board holding member. The circuit board can efficiently and safely be installed or taken off in a limited mounting space in an electronic equipment. Also, since the case accommodating the circuit board is attached or detached, the circuit board is prevented from damage by carelessness during operation.

9 Claims, 5 Drawing Sheets

CIRCUIT BOARD MOUNTING APPARATUS

FIELD OF THE INVENTION

The present invention relates to a circuit board mounting apparatus by which a circuit board incorporating an IC (integrated circuit) and the like can be detachably mounted.

DESCRIPTION OF THE RELATED ART

In conventional electronic equipment, which is controlled by means of electronic circuits such as ICs and the like. IC and various circuit devices are assembled and fixed on a predetermined circuit board to form a circuit block. When electronic equipment is produced, a circuit block required for the use and functions of the electronic equipment is incorporated therein. For example, in the case of a game machine controlled by electronic circuits, a circuit board having a control circuit for performing more complicated control (to increase the content of the game) is incorporated in the body of the game machine together with conventional mechanical components and an electric power source.

For incorporating a circuit board in such electronic equipment, however, it is necessary to electrically connect the circuit board by inserting an edge of the circuit board into a connector usually disposed at an invisible position or by moving the circuit board to a predetermined position and connecting with a connector at the end of a cord extending in the body. In particular, in a game machine such as a slot machine or the like, in consideration of the operating position of a player, the circuit board described above is usually set at a lower position in the body. When incorporating the circuit board, an operator has to insert the circuit board and connect it taking care not to interfere with the other electric parts and machinery, while keeping his posture low, because the machine body has a hopper for accommodating coins and machinery such as rotary reel mechanism, etc. disposed in close proximity. Accordingly, there have been problems such that, as well as poor workability, the operator often bumps his hands against the parts of machines placed around the circuit board or is injured by the edges of the circuit board itself. Also, accidents are apt to occur such that the IC is broken due to flow of excess current to the circuit board caused by a wrong connection, etc.

SUMMARY OF THE INVENTION

An object of the present invention is to overcome the above mentioned problems and to provide a circuit board mounting apparatus capable of attaching and detaching a circuit board with high efficiency and high safety in the limited space afforded by electronic equipment.

According to the present invention, there is provided a circuit board mounting apparatus comprising a circuit board case for accommodating a circuit board which has an extending portion on at least one end surface, a circuit board holding member for accepting and holding said case which has a connector for electrically connecting with a terminal of the circuit board, and a supporting member for rotatably supporting said case by engaging with said extending portion of said case, wherein said case is detachably mounted on said circuit board holding member by pivotally moving said case thus using said supporting member as a support.

According to the above-mentioned circuit board mounting apparatus, the case accommodating the circuit board is mounted on the circuit board holding member by engaging the extending portion of the case with the supporting member and moving rotatively making the supporting member as supporting, whereby the terminal of the circuit board is connected with the connector. For disconnecting the connection, the circuit board case is moved rotatively in the reverse direction making the supporting member engaged with the extending portion of the case as the supporting point, so that the terminal of the circuit board is detached from the connector and the case is taken off from the circuit board holding member.

DETAILED DESCRIPTION OF THE PREFERRED EMBODIMENT

Figure 1:
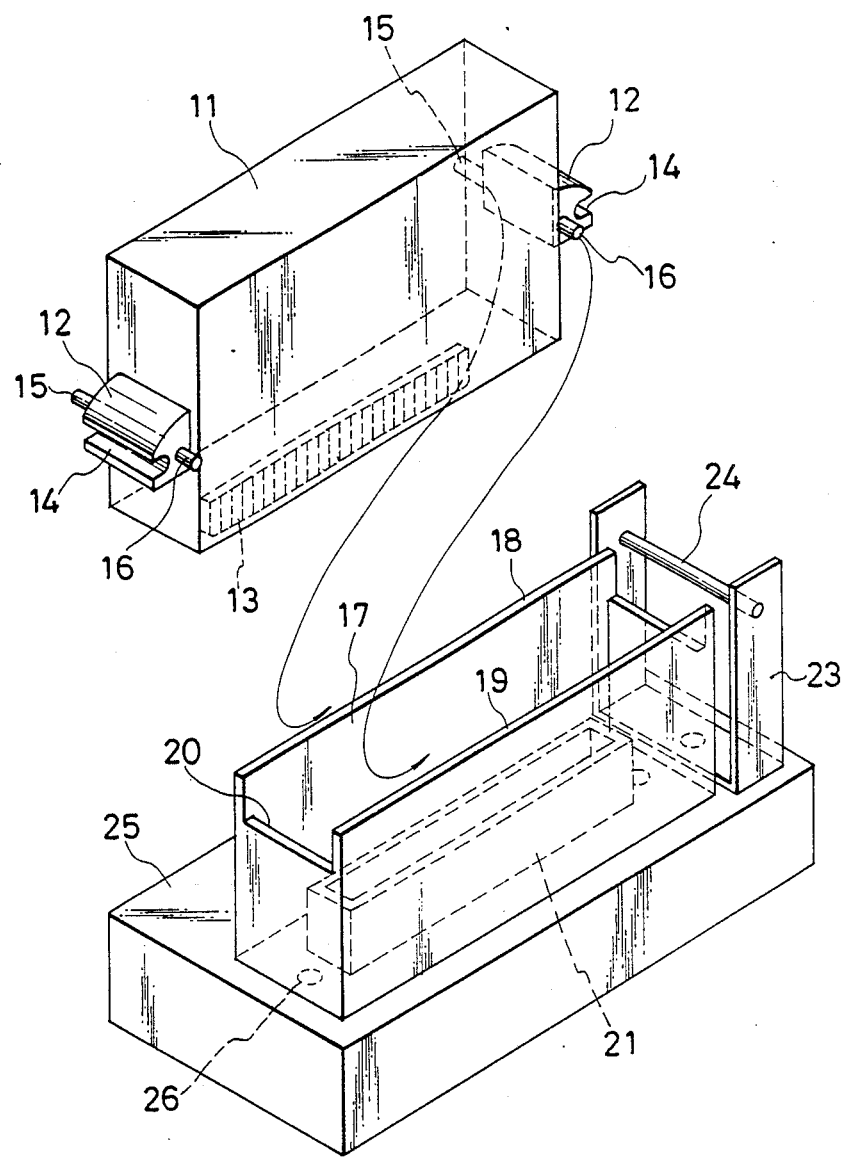
FIG. 1 is a perspective view showing a preferred embodiment of the present invention.

FIG. 1 shows an embodiment of the present embodiment. In the drawing, a case 11 is a rectangular parallelopiped accommodating a circuit board and has extending portions 12 on its opposite end surfaces. An edge portion of the circuit board, that is, a terminal 13, extends from the lower surface of the case.

The extending portions 12 are shorter in width than the case 11, and each has a transverse recess 14 at the top thereof for engaging a supporting member 23 which will be explained later. Each of the extending portions 12 is provided with shaft-like projections 15 and 16 which extend coaxially from opposite sides in the vertical direction relative to the opposite side surfaces. The pair of projections 15 and 16 act as sliders for sliding along edges 18, 19 of a case accepting portion of a circuit board holding member 17. In this embodiment, since the extending portion 12 having a shape shown in the drawing is provided on each of the end surfaces, the case 11 can be inserted into the circuit board holding member 17 from each side. Also, the extending portion 12 in the front side can also be utilized as a grip when the case 11 mounted on the holding member 17 is taken off. However, the front extending portion 12 is unnecessary to have the recess 14 and a pair of projections 15, 16 unless the case 11 is inserted in the reverse direction.

The circuit board case 11 mentioned above is mounted detachably and attachably on the holding member 17. The holding member 17 is formed as a rectangular parallelopiped box so as to accommodate the lower part of the case II. The tops of both end surfaces thereof are cut off to form recess portions 20 in order to facilitate insertion of the case 11 while inclining it, as mentioned later. Also, at an inside bottom surface of the holding member 17, there is disposed a connector 21 for electrically connecting with the terminal 13 of the circuit board when the case 11 is mounted.

Behind the rear surface of the holding member 17, a U-shaped supporting member 23 is disposed at a predetermined distance. The supporting member 23 is provided with a crossbar 24 for fitting in the recess portion 14 of the extending portion 12 of the case 11 so as to pivotally support the case. The crossbar 24 is located at a position to engage the extending portion 12 when the pair of projections 15, 16 of the case 11 have slid from the front side to the rear side of the circuit board holding member 17.

The circuit board holding member 17 and the supporting member 23 are fixedly connected by fasteners, such as a screw 26 or the like, at the above-mentioned distance on a base 25 accommodating circuit devices such as an electric power source and the like for electrically connecting with the circuit board via the connector 21.

Figure 7:
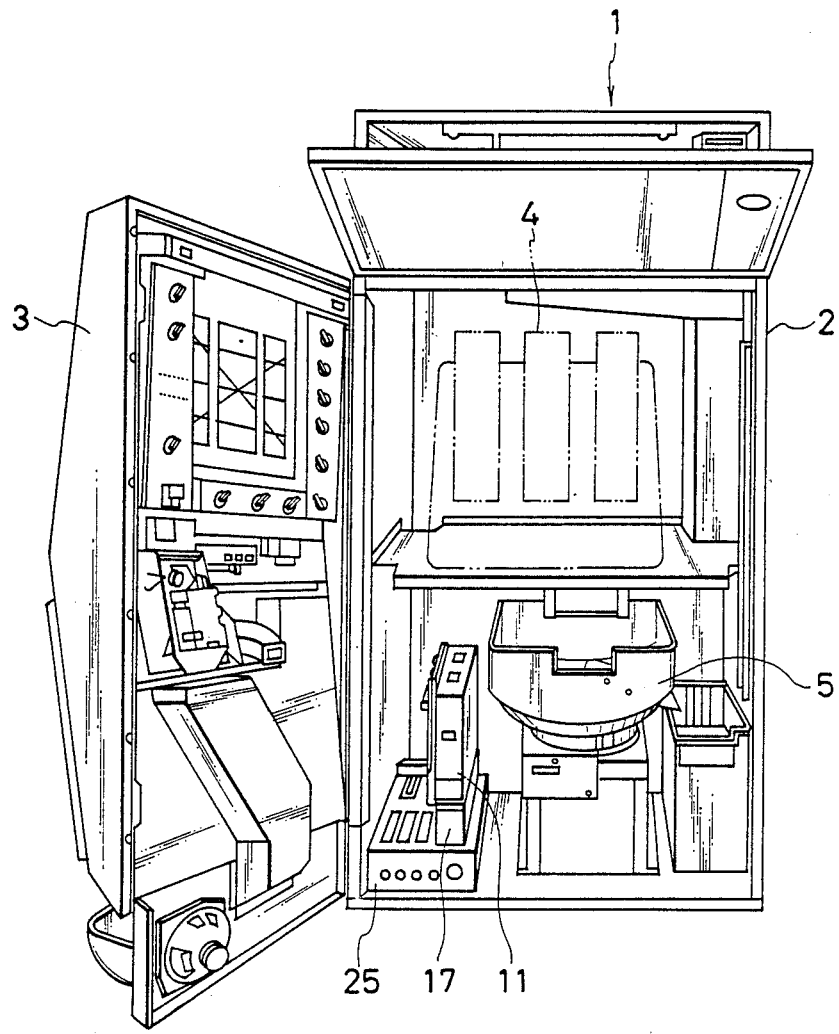
FIG. 7 is a perspective view showing an inside construction of a slot machine using the embodiment of the present invention.

This embodiment is to be positioned at a lower part in the body 2 of, for example, a slot machine 1 as shown in FIG. 7. The body 2 of the slot machine shown in the drawing is equipped with a front door 3 so as to freely open and shut. The inside of the body 2 is partitioned into upper and lower parts. In the upper part, there is provided a rotary reel mechanism 4 of the slot machine and the like. In the lower part, the base 25 on which the circuit board holding member 17 and the supporting member 23 mentioned above, together with a coin accommodating hopper 5 and the like are positioned. The circuit board case 11 is attachably and detachably coupled to the holding member 17.

Figure 2:
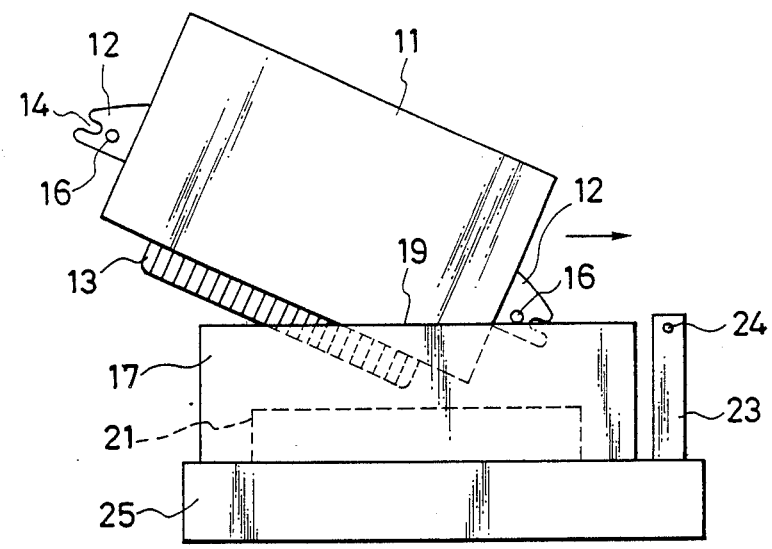
FIGS. 2–4 are side views showing operation of the embodiment of FIG. 1.
Figure 3:
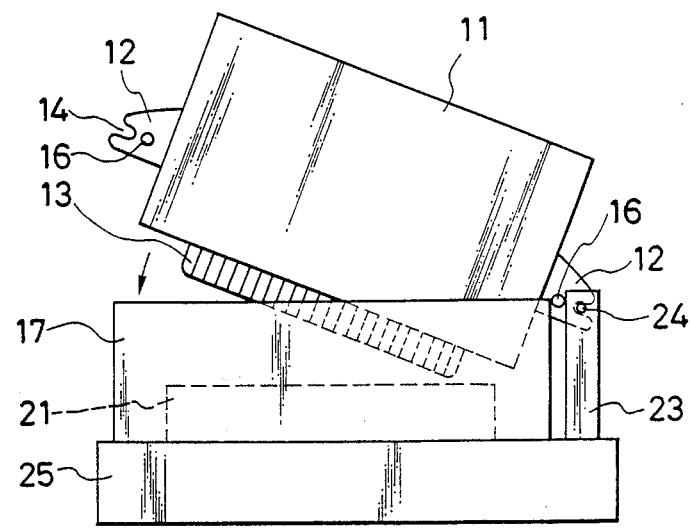
Figure 4:
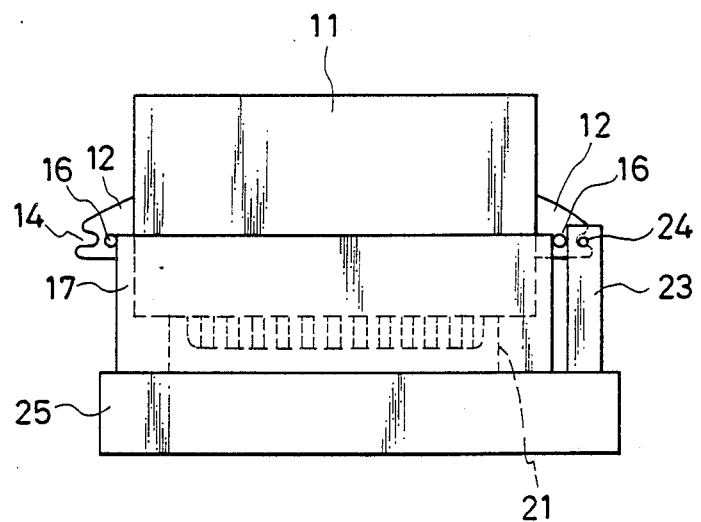

The function of the embodiment of FIG. 1 is described below with reference to FIGS. 2 through 4.

At first, when the circuit board case 11 is to be installed in the circuit board holding member 17, the case 11 is held by hand and the pair of projections 15 and 16 of the extending portion 12 positioned in the rear side are placed on the upper edges 18, 19 of the case acceptor portion of the holding member 17. The lower portion of the rear side of the case 11 is placed in the holding member while the front side of the case 11 is lifted to incline the case 11 as shown in FIG. 2. In this state, when the pair of projections 15 and 16 are caused to slide along the upper edges 18, 19 of the holding member 17 toward the rear end, the pair of projections 15 and 16 will eventually drop into a space between the holding member 17 and the supporting member 23. Simultaneously, the recess 14 of the extending portion 12 is fitted with the crossbar 24 of the supporting member 23 as shown in FIG. 3. Subsequently, the front part of the case 11 is pushed down and pivoted making the crossbar 24 engaged with the extending portion 12 as support to put the whole lower part of the case 11 into the holding member 17, whereby the terminal 13 of the circuit board is fitted in the connector 21 to electrically connect the circuit board with the devices in the base 25, as shown in FIG. 4.

When the case 11 is taken off for exchange or the like from the state where the circuit board has been installed as mentioned above, the extending portion 12 of the front side is lifted by fingers, whereby the case 11 is pivoted upwardly using the crossbar 24 as a supporting point. Thus, the terminal 13 of the circuit board is separated from the connector 21, resulting in release of the electrical connection with the devices in the base 25. Thereafter, when the case 11 is pulled forwardly after lifting, the pair of projections 15, 16 slide along the upper edges 18, 19 of the circuit board holding member 17 so that the case 11 can be easily pulled out.

As mentioned above, the embodiment of FIG. 1 is constructed so that the circuit board is easily attached to and detached from the connector 21 in the holding member by pivotally engaging the extending portion 12 of the circuit board case 11 with the crossbar 24 of the supporting member 23.

Figure 5:
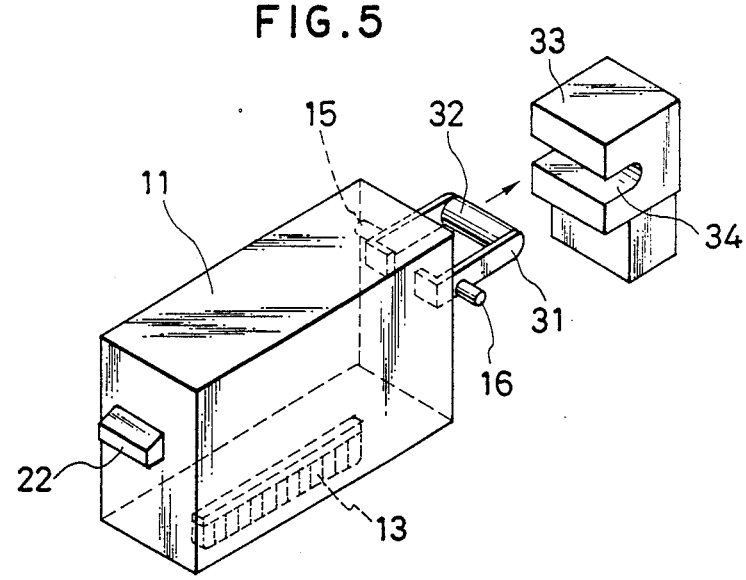
FIGS. 5–6 are perspective views of other embodiments, respectively.

In the FIG. 5 embodiment, engaging structure of the extending portion provided on an end surface of a circuit board case with a supporting member is in reverse relation to that in the embodiment of FIG. 1. That is, a case 11 has a U-shaped extending portion 31 fixed on a rear end surface. This extending portion 31 has a part parallel to the end surface of the case formed as a crossbar 32 having a circular cross section. A supporting member 33 is shaped like an angular pillar having a recess 34 on the top thereof for rotatably fitting therein the crossbar 32 of the extending portion 31. Consequently, when the case 11 of this embodiment is attached to or detached from the circuit board holding member 17 mentioned above, the crossbar 32 of the extending portion 31 is fitted in the recess 34 of the supporting member 33 and the case 11 is moved pivotally. Thus, the circuit board can easily be attached to or detached from the connector 21 in the holding member.

In this embodiment, the case 11 has a knob 22 extending from the front surface and a pair of projections 15, 16 mentioned above disposed in the right and left sides of the extending portion 31 in the rear surface.

Figure 6:
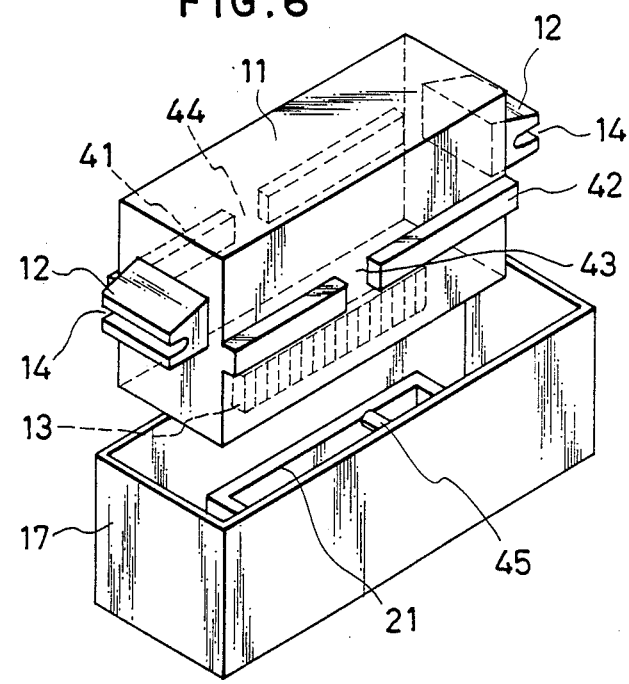

In the FIG. 6 embodiment, in the same manner as in the embodiment of FIG. 1, a circuit board case 11 has extending portion 12 on the front and rear surfaces. However, a sliding portion of the case 11 sliding along upper edges 18, 19 of the circuit board holding member 17 comprises a pair of elongated projections 41, 42, instead of the pair of projections 15, 16 mentioned above, provided on the both side surfaces in the longitudinal direction of the case 11 parallel to the upper and the lower surfaces. Each of the elongated projections has a cutout 43, 44 at the center. The holding member 17 has projections 45 provided near the upper ends of insides of both side walls, respectively.

Consequently, when the case 11 is attached to the circuit board holding member 17, the pair of elongated projections 41, 42 slide on the projection 45 of the holding member 17 from the front side to the position of the rear surface until reaching a position where the cutouts 43 and 44 meet the projections 45. Then, the pair of the elongated projections 41 and 42 fall down and simultaneously the recess 14 of the extending portion 12 engage the crossbar 24 of the supporting member 23. Accordingly, in the same manner as in the embodiment of FIG. 1, the front part of the case 11 is pushed down and pivotally moved using the crossbar 24 as a supporting point. Thus, the terminal 13 of the circuit board can be fitted in the connector 21 to electrically connect with the devices in the base 25.

On the other hand, when the case 11 is taken out, the extending portion 12 of the extending portion 12 of the front side is lifted by fingers to move the case 11 pivotally upwardly using the crossbar 24 as a supporting point again, whereby the terminal 13 of the circuit board is disconnected from the connector 21. Thereafter, when the case 11 is pulled forwardly in the lifted state, the pair of elongated projections 41, 42 slide on the projections 45 so that the case 11 can be easily pulled out.

It is further understood by those skilled in the art that the foregoing description is of preferred embodiments of the disclosed embodiment and that various changes and modifications may be made in the invention without departing from the spirit and scope thereof. For example, it is possible that the shapes of the circuit board case and the holding member may be those other than the rectangular parallelopiped shown in the drawings. Also, the circuit board case may be constructed so as to accommodate the edge portion of the circuit board inside without exposing it outside and to electrically connect with an external circuit by means of IC connector or the like. Further, the apparatus of the present invention can be applied for electronic equipments such as personal computer and the like having a circuit board holding member in which a cartridge-type IC is attached and detached.

As mentioned above, according to the present invention, the extending portion of the circuit board case is freely rotatively engaged with the supporting member, so that the circuit board can easily be attached to and detached from the connector of the holding member. Consequently, the circuit board can efficiently and safely be installed or taken off in the limited mounting space in electronic equipment. Also, since the case accommodating circuit board is attached or detached, the circuit board is prevented from damage by carelessness during the operation. Further, the position of the connector in the holding member can be set off the center to obtain an effect that the circuit board can be prevented from adverse insertion.

What is claimed is:

1. A circuit board mounting apparatus comprising:
   a rectangular case including a circuit board, said case having an extending portion on at least a leading end, projections on opposite sides of the extending portion and a circuit board terminal projecting out of a bottom of said case;
   a holding member for receiving and holding said case, said holding member having an opening on an upper surface thereof and an inside connector for connecting with said terminal; and
   a supporting member positioned adjacent a rear end of said holding member, said supporting member having pivoting means for pivoting said extending portion of said case;
   said projections of said case being slidable along upper edges of said holding member;
   said extending portion having means for engaging said pivoting means of said supporting member when said projections slide along the upper edges to the rear end of said holding member while tilting said case, whereby said case is detachably mounted onto said holding member.

2. A circuit board mounting apparatus comprising:
   a case having a lower surface and two opposite axial ends;
   a circuit board terminal extending outwardly from the lower surface of the case;
   a holding member having two opposite axial ends, an upper opening and a connector extending upwardly from within for connecting to the circuit board terminal;
   support means disposed adjacent one of the opposite axial ends of the holding member for supporting the case during movement towards and away from a connecting position of the circuit board terminal;
   said case being slidable over the holding member toward the support means to a predetermined rearward position; and
   detachable hinge means for pivotally coupling the case to the holding member during movement towards and away from the connecting position of the circuit board terminal.

3. A circuit board mounting apparatus according to claim 2, wherein the axial end of the case opposite the end adjacent the supporting means is tilted upwardly relative to the holding means when sliding over the holding means, and wherein the case is pivoted downwardly after reaching the rearward position.

4. A circuit board mounting apparatus according to claim 2, further comprising guide means associated with the case and the holding member for guiding the case during sliding rearward movement towards the support means.

5. A circuit board mounting apparatus according to claim 4, wherein the detachable hinge means includes a first extending portion formed on one of the two opposite ends of the case.

6. A circuit board mounting apparatus according to claim 5, wherein the first extending portion has a U-shaped recess formed transversely relative to a longitudinal direction of both the case and the holding member, and wherein the supporting member includes a crossbar fitting into the U-shaped recess of the extending portion of the case.

7. A circuit board mounting apparatus according to claim 5, wherein the detachable hinge means further includes a second extending portion disposed on the other of the two opposite axial ends.

8. A circuit board mounting apparatus according to claim 5, wherein the first extending portion comprises a U-shaped extension, and the support means includes a U-shaped recess for receiving a portion of the U-shaped extension.

9. A circuit board mounting apparatus according to claim 5, wherein the guide means comprises an upper edge of the holding member and a cooperating pair of projections formed on the first extending portion.

* * * * *